United States Patent [19]
Shimokoriyama et al.

[11] Patent Number: 5,877,908
[45] Date of Patent: Mar. 2, 1999

[54] MODULATING DEVICE FOR RECORDING PILOT SIGNALS

[75] Inventors: Makoto Shimokoriyama, Kawasaki; Shingo Nozawa, Yokohama, both of Japan

[73] Assignee: Canon Kabushiki Kaisha, Tokyo, Japan

[21] Appl. No.: 496,086

[22] Filed: Jun. 28, 1995

[30] Foreign Application Priority Data

Jun. 29, 1994 [JP] Japan .................................. 6-147644

[51] Int. Cl.$^6$ ................................ G11B 5/09; H03M 5/00
[52] U.S. Cl. ............................................. 360/40; 341/58
[58] Field of Search .................................. 360/39, 40, 41, 360/48; 341/68, 101, 102, 58, 95

[56] References Cited

U.S. PATENT DOCUMENTS

| | | | |
|---|---|---|---|
| 5,016,258 | 5/1991 | Tanaka et al. | 375/25 |
| 5,142,421 | 8/1992 | Kahlman et al. | 360/40 |
| 5,432,651 | 7/1995 | Maeno et al. | 360/41 |
| 5,602,547 | 2/1997 | Maeno et al. | 360/40 |
| 5,671,101 | 9/1997 | Senshu et al. | 360/77.13 |

*Primary Examiner*—Aristotelis M. Psitos
*Assistant Examiner*—Regina Y. Neal
*Attorney, Agent, or Firm*—Fitzpatrick, Cella, Harper & Scinto

[57] ABSTRACT

In a device or a recording apparatus for converting n-bit data into m-bit data with different conversion methods, and selecting and outputting one of a plurality of converted m-bit data, when controlling output means in accordance with the plurality of m-bit data, a specific signal component is extracted from each of the plurality of m-bit data, the absolute values of the plurality of extracted outputs are obtained, and at least one of the plurality of absolute values or the extracted output corresponding thereto is selectively output (recorded). Thus, superposition and suppression of a specific frequency component can be realized by a single circuit having a very simple circuit configuration. As a result, the size and the cost of a digital signal recording apparatus utilizing a modulation circuit of this kind can be reduced.

32 Claims, 8 Drawing Sheets

MODULATING DEVICE FOR RECORDING PILOT SIGNALS

BACKGROUND OF THE INVENTION

1. Field of the Invention

This invention relates to a digital modulating device for modulating a digital signal, and to a recording apparatus for recording a digital signal on a recording medium. More particularly, the invention relates to a digital modulating device for converting n-bit data into m (>n)-bit data, and to a digital recording apparatus for recording a signal component having a specific frequency as a pilot signal added to main information while controlling the intensity of the signal component.

2. Description of the Related Art

In conventional apparatuses for recording a digital signal on a recording medium, there has been known a technique in which high-density recording is performed by recording the signal by forming a large number of tracks on the recording medium. When reproducing a recorded signal from such an apparatus, a so-called tracking control operation must be performed so that a reproducing head can assuredly trace high-density recording tracks and digital information can be reproduced in an excellent state.

In an ordinary tracking operation, a pilot signal for tracking control is superposed on a recording signal during a recording operation, and a tracking error is detected using the pilot signal. A technique of superposing a pilot signal having a low frequency which is not influenced by an azimuth and the like is generally adopted.

FIG. 1 is a diagram illustrating a conventional recording pattern of pilot signals, in which two kinds of pilot signals f1 and f2 are periodically multiplexed with an information signal on a large number of tracks recorded in parallel on a recording tape T. In FIG. 1, symbol $F_0$ represents a track on which a pilot signal is not multiplexed, symbol $F_1$ represents a track on which the pilot signal f1 is multiplexed, and symbol F2 represents a track on which the pilot signal f2 is multiplexed.

In a reproducing operation, while a head traces a track $F_0$, the crosstalk component of the pilot signal f1 from a track $F_1$ adjacent to the track $F_0$ and the crosstalk component of the pilot signal f2 from a track $F_2$ adjacent to the track $F_0$ are compared with each other to form a tracking-error signal.

However, when it is intended to apply the above-described tracking control (of multiplexing pilot signals) to a digital recording apparatus, a pilot signal and a recording signal (containing main information) are superposed independently. As a result, the S/N ratio of a digital signal in a reproducing operation is degraded, causing an increase in the error rate of reproduced data. This causes degradation in a reproduced image when the tracking control is applied to a digital VCR (video cassette recorder).

Furthermore, a strong spectrum of the digital recording signal is present in the vicinity of the frequency of the pilot signal, thereby causing degradation in the S/N ratio of the pilot signal in a reproducing operation, as well as degradation in tracking accuracy. This also causes degradation in a reproduced image when the tracking control is applied to a digital VCR.

Recently, there has been proposed a technique in which a pilot signal is superposed on a digital recording signal while including a pilot-signal component in a digital modulating signal. However, a very complicated circuit configuration is required for realizing such a proposal.

SUMMARY OF THE INVENTION

It is an object of the present invention to solve the above-described problems.

It is another object of the present invention to provide a digital modulating device capable of superposing a signal component having a desired frequency on a digital modulated signal with a relatively simple circuit configuration.

According to one aspect, the present invention, which achieves the above-described object, relates to a digital modulating device, comprising conversion means for converting n-bit data into m-bit data with different conversion methods, output means for selecting and outputting one of a plurality of m-bit data output from the conversion means, and control means for controlling the output means in accordance with the plurality of m-bit data. The control means comprises a plurality of extraction means for extracting a specific signal component from each of the plurality of m-bit data, a plurality of absolute-value calculation means for obtaining the absolute values of outputs from the plurality of extraction means, and switching means for selectively outputting an output from at least one of the plurality of absolute-value calculation means and an output from the extraction means corresponding to the output.

According to the above-described configuration, when it is intended to superpose a specific signal, the switching means may select the output of the extraction means. When it is intended to suppress the environment of the frequency component relating to the specific signal, the output of the absolute-value calculation means may be selected. Accordingly, a specific signal can be superposed on a modulated signal without separately providing a circuit for superposing the specific frequency component.

According to another aspect, the present invention relates to a digital modulating method, comprising the steps of converting n-bit data into m-bit data with different conversion methods, extracting a specific signal component from each of a plurality of m-bit data output as a result of the conversion, obtaining the absolute value of each of the plurality of extracted specific signal components, and outputting one of the plurality of m-bit data by selectively using the absolute-value and the specific signal component.

According to still another aspect, the present invention relates to a digital modulating device, comprising modulation means for modulating digital data by different modulation methods, output means for selecting and outputting one of data output from the modulation means, and control means for controlling the output means in accordance with the output of the modulation means. The control means extracts a specific signal component from each of the output data, and controls the output means by selectively using data indicating the amplitude of the extracted component and data indicating the power of the extracted component.

It is still another object of the present invention to provide a digital recording apparatus capable of recording a digital signal on a recording medium in a state of being superposed with a signal component having a desired frequency with a simple circuit configuration.

According to yet another aspect, the present invention, which achieves the above-described object, relates to a digital signal recording apparatus, comprising conversion means for converting n-bit data into m-bit data with different conversion methods, recording means for selecting one of a plurality of m-bit data output from the conversion means and recording the selected data on a recording medium, and control means for controlling the selection operation of the recording means in accordance with the plurality of m-bit data. The control means comprises a plurality of extraction means for extracting a specific signal component from each of the plurality of m-bit data, a plurality of absolute-value calculation means for obtaining the absolute values of outputs from the plurality of extraction means, and switching means for selectively outputting an output of at least one of the plurality of absolute-value calculation means and an output from the extraction means corresponding to the output.

According to yet a further aspect, the present invention relates to a digital signal recording apparatus, comprising modulation means for modulating digital data with different modulation methods, recording means for selecting one of data output from the modulation means and recording the selected data on a recording medium, and control means for controlling the selection operation of the recording means in accordance with an output from the modulation means. The control means extracts a specific signal component from each of the output data, and controls the selection operation by selectively using data indicating the amplitude of the extracted component and data indicating the power of the extracted component.

The foregoing and other objects, advantages and features of the present invention will become more apparent from the following detailed description of the preferred embodiment taken in conjunction with the accompanying drawings.

DETAILED DESCRIPTION OF THE PREFERRED EMBODIMENT

A preferred embodiment of the present invention will now be described with reference to the drawings.

Figure 3:
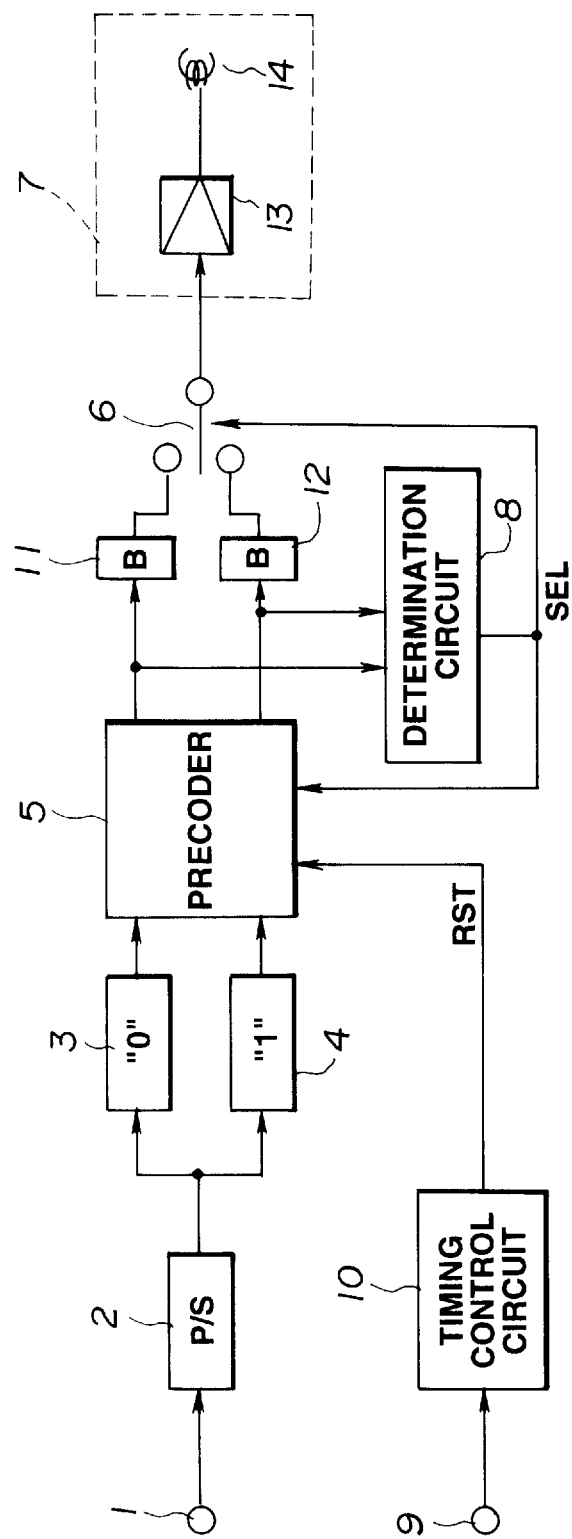
FIG. 3 is a diagram illustrating the configuration of a principal portion of a digital recording apparatus according to an embodiment of the present invention.

FIG. 3 is a diagram illustrating the configuration of a principal portion of a digital signal recording apparatus according the preferred embodiment. In FIG. 3, parallel data comprising a plurality of bits (for example, 8 bits) is input to a terminal 1. This signal is input to a parallel/serial converter 2 to become a binary-bit stream, and is then input to a "0" inserter 3 and a "1" inserter 4. That is, the same data is input to the inserters 3 and 4.

Figure 2:
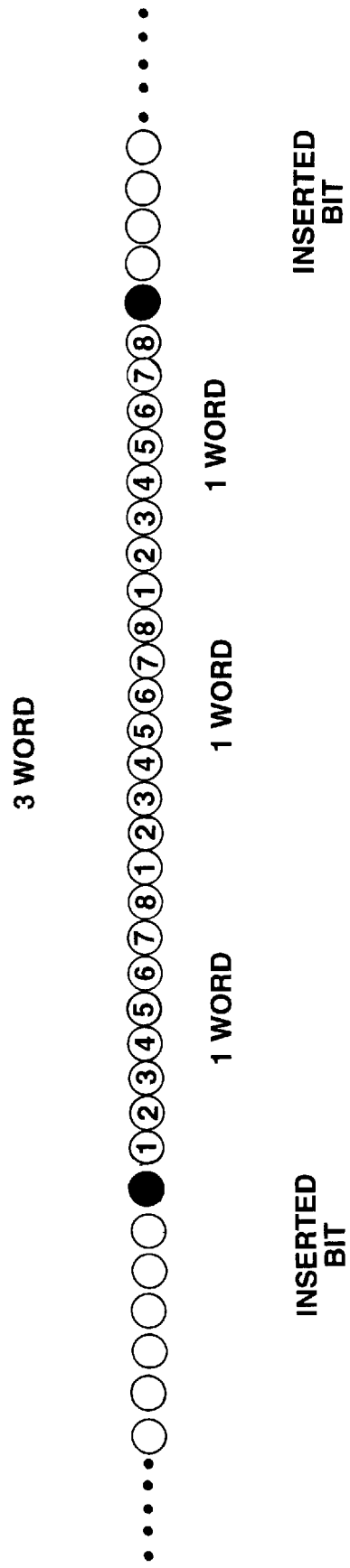
FIG. 2 is a schematic diagram illustrating a string of modulated data to be recorded.

The "0" inserter 3 inserts 1-bit binary information "0" for every predetermined number of data, for example, as shown in FIG. 2, for every three words (24 bits). Similarly, the "1" inserter 4 inserts 1-bit binary information "1" for a predetermined number of data (24 bits). Output data strings (bit streams) from the inserters 3 and 4 are input to an NRZI (non-return-to-zero-inverted) precoder 5. Although the precoder 5 will be described later in detail, it has the configuration shown in FIG. 4. The precoder 5 outputs different data strings for a data string in which binary information "0" is inserted and for a data string in which binary information "1" is inserted.

Two kinds of data strings are output from the precoder 5 and are input to a switch 6 and to a determination circuit 8. Although the determination circuit 8 will be described later in detail, it has the configuration shown in FIG. 5. In order to detect the intensity of a specific frequency component for each data string and to suppress or emphasize the specific frequency component, the determination circuit 8 outputs a selection signal SEL for selecting one of (i) a modulated data string obtained from a data string in which the above-described binary information "0" is inserted, and (ii) a modulated data string obtained from a data string in which the binary information "1" is inserted from the output of the precoder 5. The switch 6 is controlled by this selection signal SEL. A pair of modulated data strings output from the precoder 5 are delayed by buffers 11 and 12 for a period necessary for determination by the determination circuit 8, and are then selectively output by the switch 6. A magnetic recording device 7 includes a recording amplifier 13 and a recording head 14.

Figure 4:
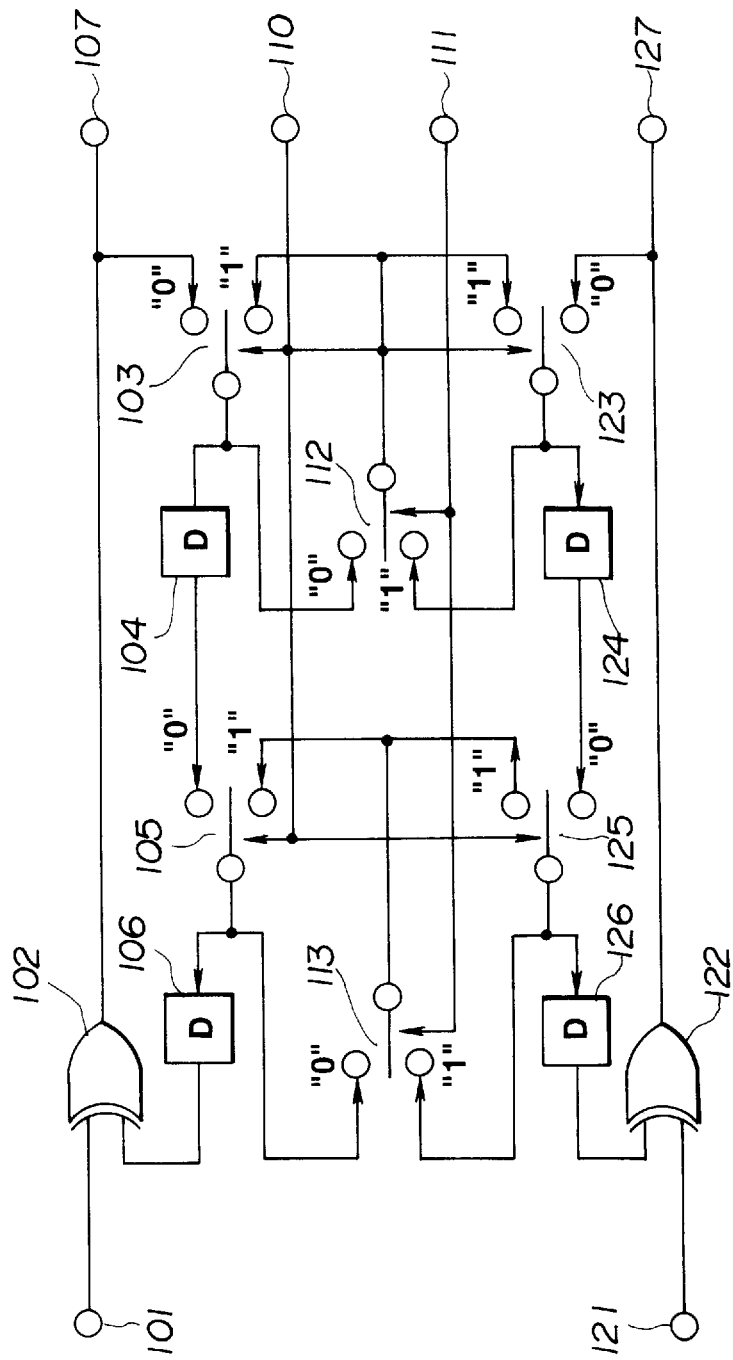
FIG. 4 is a diagram illustrating the configuration of a precoder shown in FIG. 3.

The configuration of the precoder 5 will now be described in detail with reference to FIG. 4. In FIG. 4, a data string from the "0" inserter 3 is input to an input terminal 101. A data string from the "1" inserter 4 is input to an input terminal 121. Switches 103, 105, 123 and 125 are usually connected to the "0" side. Exclusive OR's of data of data strings input to the respective input terminals and data of the same data strings which precede the respective data by two bits and have been delayed by 1-bit delay circuits 104 and 106, and 124 and 126 are obtained by EX-OR circuits 102 and 122, and the obtained data are output from output terminals 107 and 127, respectively.

When the final bit of 25 bits, comprising an inserted 1 bit and information bits for three words, is input to the terminals 101 and 121, a selection signal SEL indicating which of the 25-bit data must be selected is input to a terminal 111. A timing control circuit 10 shown in FIG. 3 generates a reset signal RST at the timing of the input of the final bit to the precoder 5 in response to a clock signal input to a terminal 9. The reset signal RST is input to the terminal 110 shown in FIG. 4 to connect the respective switches 103, 105, 123 and 125 to the "1" side for a period corresponding to 1-bit data, whereby the signal of a modulated data string selected by the selection signal SEL is input to the 1-bit delay circuits 104 and 106, or 124 and 126 via the switch 112 or 113, respectively.

Accordingly, when inserted bits of respective 25 bits are input to the terminals 101 and 121, the final bit of the selected 25-bit data string is output from the delay circuits 104 or 124, and a bit preceding the final bit by two bits is output from the delay circuits 106 or 126, respectively. Since an exclusive OR of data and data preceding the data by two bits is always calculated except in this reset operation, codes of odd-bit data are controlled by an inserted bit in the first 25 bits, and codes of bit data which have not been controlled in the preceding 25 bits are controlled in the succeeding 25 bits.

Figure 5:
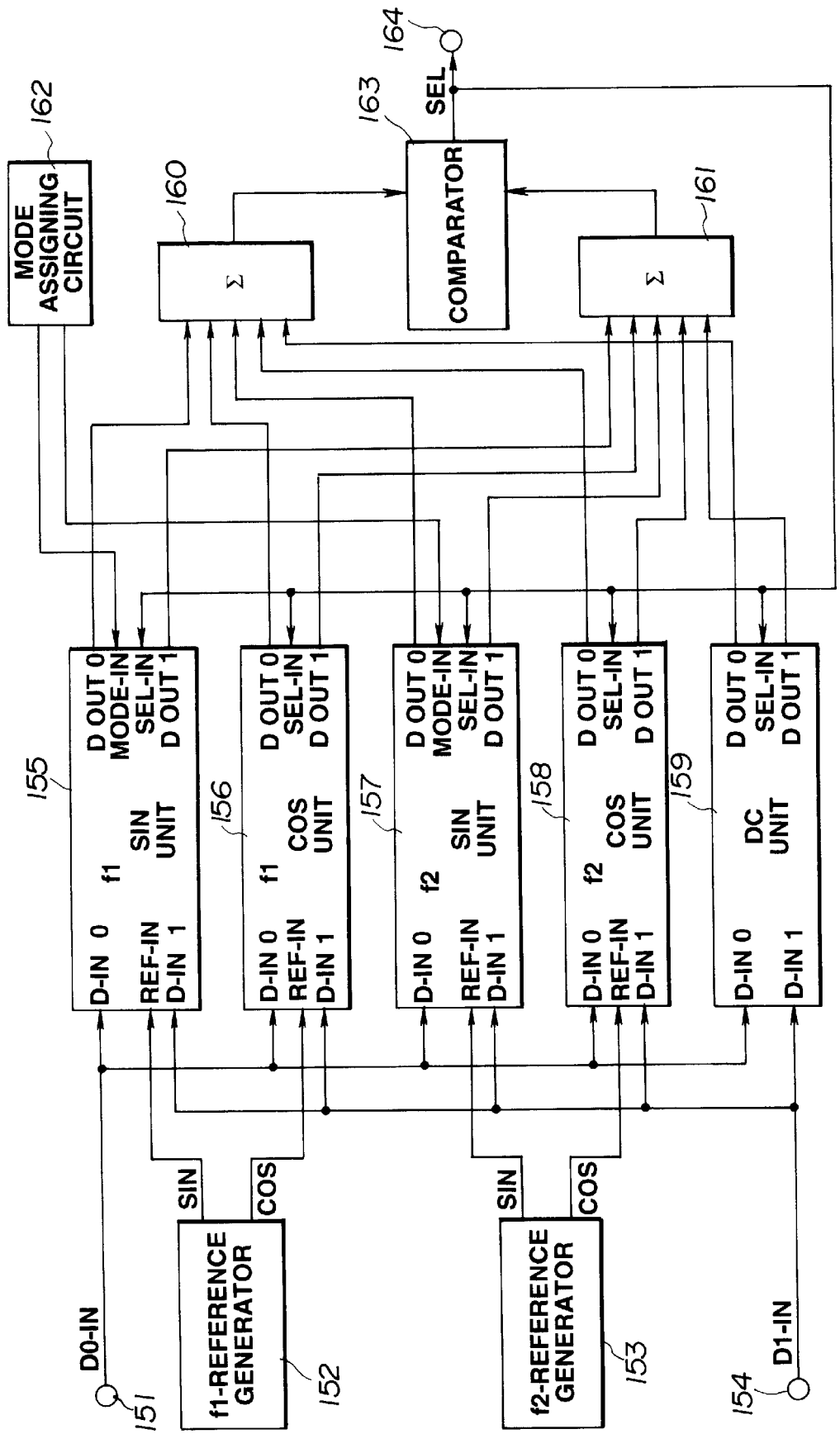
FIG. 5 is a diagram illustrating the configuration of a determination circuit shown in FIG. 3.

Next, a description will be provided of the configuration of the determination circuit 8 shown in FIG. 3 with reference to FIG. 5. In FIG. 5, two outputs of the precoder 5 shown in FIG. 3, i.e., a modulated data string obtained from a data string in which binary information "0" is inserted (D0-in) and a modulated data string obtained from a data string in which binary information "1" is inserted (D1-in) are input to input terminal 151 and 154, respectively. Reference numeral 155 represents an f1-SIN unit for extracting a sine (SIN) component having a frequency f1, reference numeral 156 represents an f1-COS unit for extracting a cosine (COS) component having the frequency f1, reference numeral 157 represents an f2-SIN unit for extracting a sine (SIN) component having a frequency f2, reference numeral 158 represents an f2-COS unit for extracting a cosine (COS) component having the frequency f2, and reference numeral 159 represents a DC unit for extracting a DC component.

Reference numeral 152 represents an f1-reference generator for generating a reference signal having the frequency f1, which generates a sine wave and a cosine wave having the frequency f1Reference numeral 153 represents an f2-reference generator for generating a reference signal having the frequency f2, which generates a sine wave and a cosine wave having the frequency f2. The generated signals are input to reference-signal input terminals (Ref-in) of the corresponding units. The modulated data string (D0-in) and the modulated data string (D1-in) are input to input terminals D-in 0 and D-in 1 of the units 155, 156, 157, 158 and 159, respectively.

Figure 6:
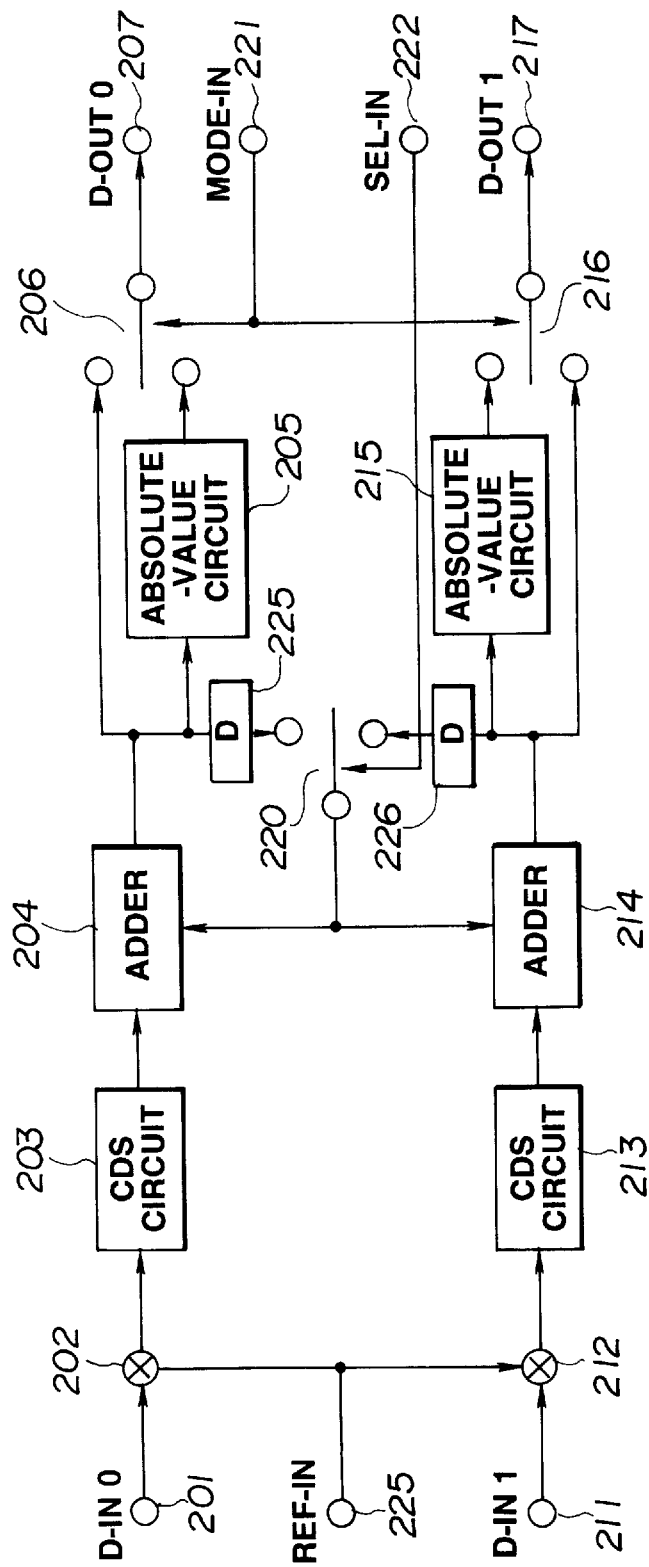
FIGS. 6 and 7 are diagrams illustrating the configuration of signal extraction units of a digital modulation circuit shown in FIG. 5.
Figure 7:
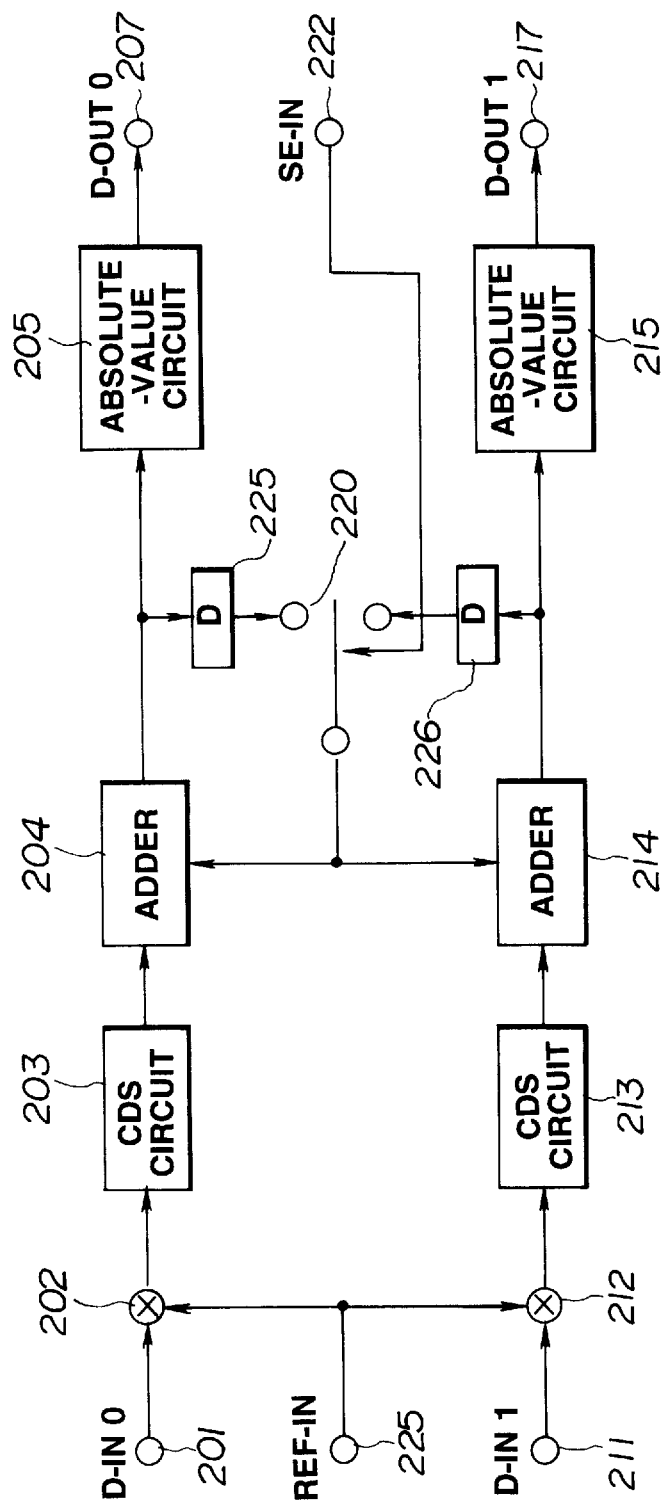

FIG. 6 illustrates the configuration of each of the units 155 and 157, and FIG. 7 illustrates the configuration of each of the units 156 and 158. The DC unit 159 has such a configuration that in the configuration shown in FIG. 7, "1" is always input to a reference-signal input terminal (Ref-in) 225. The two modulated data strings (D0-in and D1-in) are input to input terminals 201 (D-in 0) and 211 (D-in 1), and are further input to multipliers 202 and 212, respectively. A reference signal from the reference-signal input terminal (Ref-in) is input to the other terminals of the multipliers 202 and 212, and a sine component or a cosine component of each frequency is obtained from the multipliers 202 or 212.

Figure 8A:
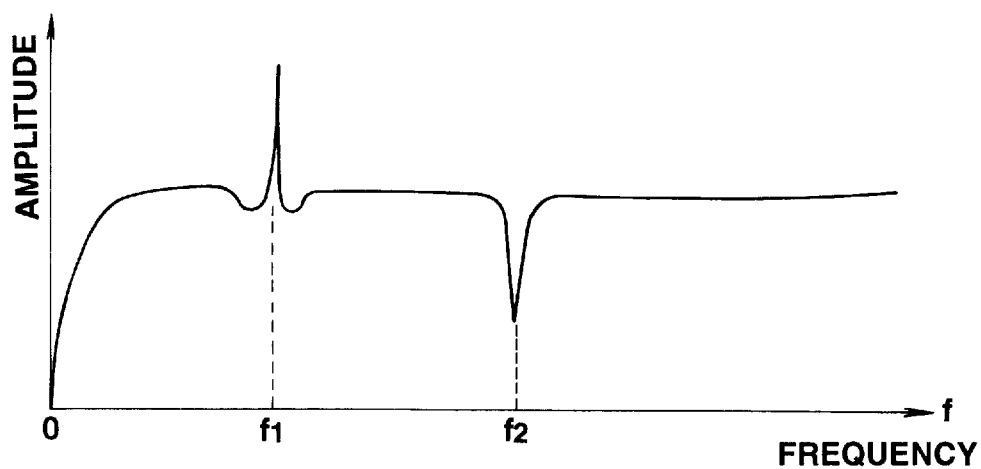
FIGS. 8(a) through 8(c) are diagrams illustrating spectra of a signal recorded by the apparatus shown in FIG. 3.

A description will now be provided of an operation for outputting a modulating signal having characteristics as shown in FIG. 8(a). The characteristics shown in FIG. 8(a) are such that a carrier (a pilot signal) is generated at the frequency f1, the spectrum attenuates in the environment thereof, a dip is generated in the spectrum in the vicinity of the frequency f2, and the spectrum is suppressed in the vicinity of the DC component.

In the multipliers 202 and 212, the respective modulated data strings (D0-in and D1-in) are multiplied by a sine component having the frequency f1, respectively. In each of the multipliers, a reference signal is multiplied by "1" when each data of a modulated data string is "1", and is multiplied by "−1" when each data of a modulated data string is "0".

The sums of data each comprising 25 bits (the same number of bits as the reference signal) from the multipliers 202 and 212 are calculated by and output from CDS (code word digital sum) circuits 203 and 213, respectively. These sums are accumulated by a pair of DSV (digital sum value) circuits comprising an adder 204 and a delay circuit 225, and an adder 214 and a delay circuit 226. An accumulated value corresponding to an actually output modulated signal is selected by a switch 220 as an accumulated value of the past. This pair of DSV circuits are reset by resetting data within the delay circuits 225 and 226 at the time to start accumulation, for example, at the time to start recording on each track.

Accumulated values input to the adders 204 and 214 are accumulated values of modulated signals which have been selected in the past. The adders 204 and 214 output values obtained by adding the sums which have been newly calculated by the CDS circuits 203 and 204 to these values, respectively. The accumulated values output from the adders 204 and 214 are input to absolute-value circuits 205 and 215, and are directly input to one terminals of data selectors 206 and 216, respectively, in a state of having a plus or minus sign. The outputs of the absolute-value circuits 205 and 215 are input to the other terminals of the data selectors 206 and 216, respectively.

Figure 8B:
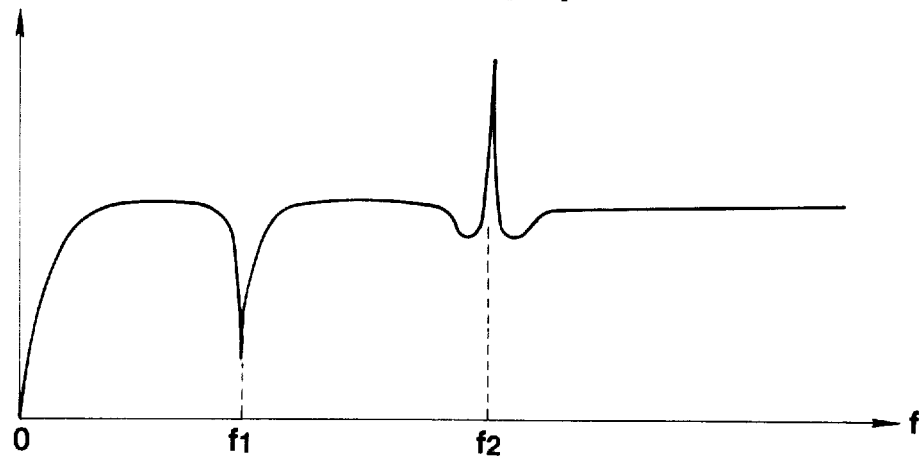
Figure 8C:
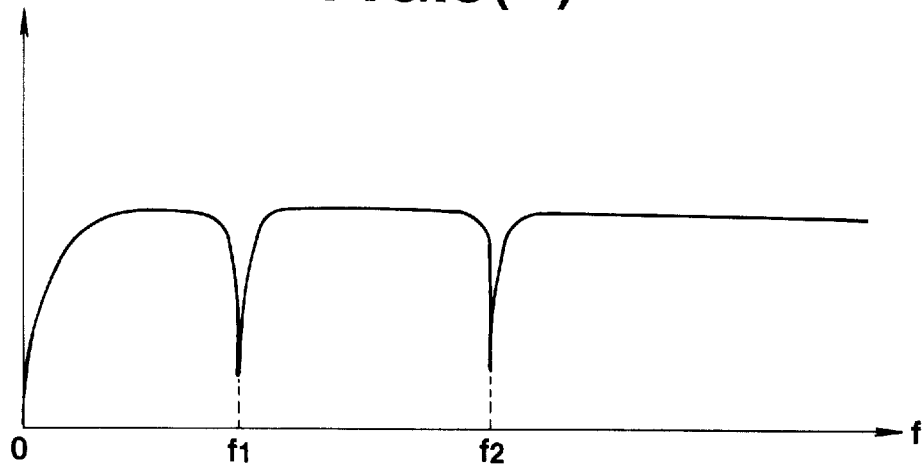

One of the mode signals (each indicating one of the characters shown in FIGS. 8(a), 8(b) and 8(c) with which a modulated signal is formed) is supplied to a mode input terminal 221 from a mode assigning circuit 162 shown in FIG. 5. The mode assigning circuit 162 supplies mode signals "1" and "0" to the units 155 and 157, respectively, when forming a modulated signal having the spectrum shown in FIG. 8(a), and supplies mode signals "0" and "1" to the units 155 and 157, respectively, when forming a modulated signal having the spectrum shown in FIG. 8(b). When forming a modulated signal having the spectrum shown in FIG. 8(c), a mode signal "0" is supplied to the units 155 and 157.

Since it is intended, in this case, to obtain a modulated signal having the spectrum shown in FIG. 8(a), a mode signal "1" is input to a mode terminal (mode-in) of the unit 155. In FIG. 6, when "1" is input to the mode input terminal (mode-in) 221, the data selector 206 and 216 output accumulated values having plus or minus signs, and these values are output from output terminals 207 (D-out 0) and 217 (D-out 1), respectively.

On the other hand, since a mode signal "0" is input to the mode input terminal 221 of the unit 157, in the unit 157, outputs from the absolute-value circuits 205 and 215 are output from output terminals 207 (D-out 0) and 217 (D-out 1) via the data selector 206 and 216, respectively. The absolute values of accumulated values of outputs from the adders 204 and 214 of the units 156, 158 and 159 are unconditionally obtained by the absolute-value circuits 205 and 215, and the obtained values are output from the output terminals 207 and 217, respectively.

Outputs from output terminals (D-out 0) of the respective units 155, 156, 157, 158 and 159 are supplied to an adder 160, and outputs from output terminals (D-out 1) of the respective units 155, 156, 157, 158 and 159 are supplied to an adder 161. The outputs of these adders 160 and 161 are compared by a comparator 163, which makes the selection signal SEL "0" when the output of the adder 160 is smaller than the output of the adder 161, and makes the selection signal SEL "1" when the output of the adder 161 is smaller than the output of the adder 160. As described above, the selection signal SEL controls the switch 6 shown in FIG. 3, so that a modulated data string obtained from a data string in which binary information "0" is inserted (as output from the precoder 5) is output when the selection signal SEL is "0", and a data string in which binary information "1" is inserted is output when the selection signal SEL is "1".

The selection signal SEL is subjected to feedback to the units 155, 156, 157, 158 and 159, and the accumulated values of the past for calculating the next accumulated values are set to the values of modulated data strings which have actually been output. That is, the selection signal SEL is input to a terminal 222 shown in FIGS. 6 and 7 to control the data selector 220, so that the output of the delay circuit 225 is input to the adders 204 and 214 when the selection signal SEL is "0", and the output of the delay circuit 226 is input to the adders 204 and 214 when the selection signal SEL is "1".

As will be described later, the selection signal SEL is also subjected to feedback to the precoder 5, and is used for making the value of past data when performing NRZI modulation of the subsequent input data string to coincide with modulated data which has acutally been output.

Next, the operation of the determination circuit 8 according to the above-described modes will be briefly described. That is, when a mode signal "0" is supplied from the mode assigning circuit 162 to the units 155 and 157, the absolute values of sine components and cosine components having the frequencies f1 and f2, and the DC component are added by the adders 160 and 161, and the entire circuitry operates so as to suppress these signal components by selecting a modulated code string at the side having a smaller addition output by the comparator 163. Accordingly, in this case, a modulated data string having the spectrum characteristics shown in FIG. 8(c) is obtained.

When a mode signal "1" is supplied from the mode assigning circuit 162 to the unit 155, the value, having a sign, of a sine component having the frequency f1 and the absolute values of all other components are added by the adders 160 and 161, and a modulated code string having a smaller addition output is selected by the comparator 163. In this case, a reference signal input to the multipliers 202 and 212 becomes a sine component having the frequency f1, which is directly supplied to the adders 160 and 161. Hence, the entire circuitry operates such that the f1 component has the spectrum corresponding to the sine wave, and other components are suppressed. Accordingly, in this case, a modulated data string having the spectrum characteristics shown in FIG. 8(a) is obtained.

When a mode signal "1" is supplied from the mode assigning signal 162 to the unit 157, the entire circuitry operates such that the f2 component has the spectrum corresponding to the sine wave, and other components are suppressed. Accordingly, in this case, a modulated data string having the spectrum characteristics shown in FIG. 8(b) is obtained.

Figure 1:
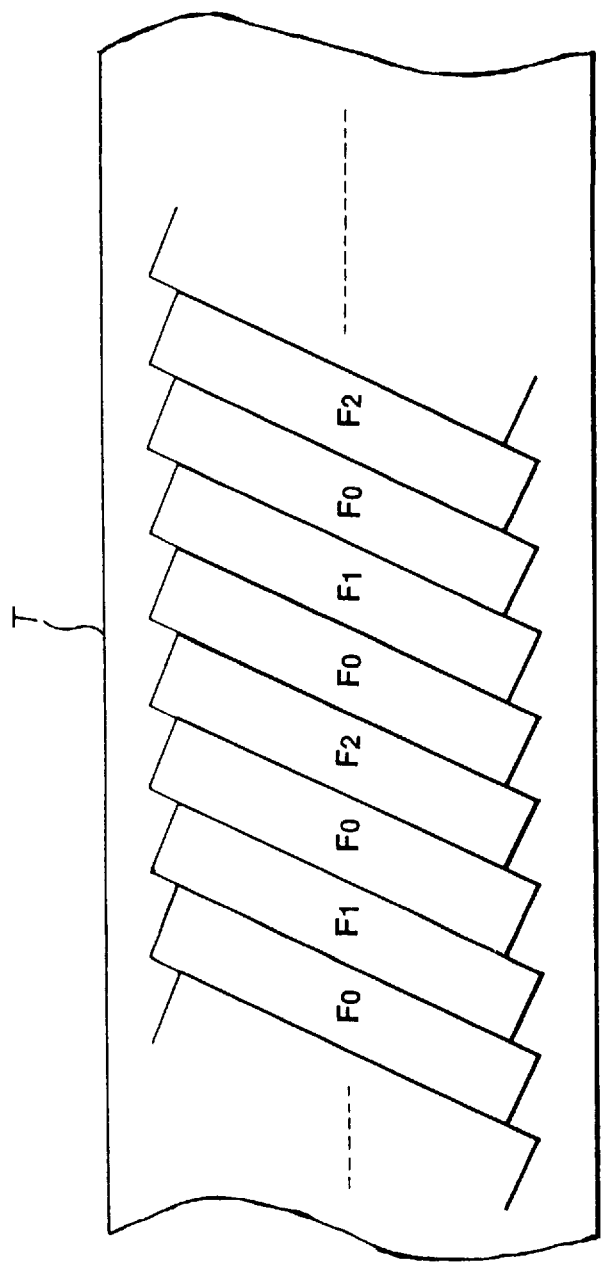
FIG. 1 is a diagram illustrating a signal recording format for performing tracking control.

Accordingly, in the case of a digital recording apparatus, pilot signals can be superposed as shown in FIG. 1 by supplying a mode signal "0" from the mode assigning circuit 162 to the units 155 and 157 when forming a track $F_0$ shown in FIG. 1, supplying from the mode assigning circuit 162 a mode signal "1" to the unit 155 and a mode signal "0" to the unit 157 when forming a track $F_1$, and supplying from the mode assigning circuit 162 a mode signal "0" to the unit 155 and a mode signal "1" to the unit 157 when forming a track $F_2$.

Although in the above-described embodiment, data from the adders 204 and 214 passing through the absolute circuits 205 and 215, and data from the adders 204 and 214 not passing through the absolute circuits 205 and 215, respectively, are selectively output, the same effects may be also obtained by selectively outputting only data from one of the adders 204 and 214 passing through the corresponding absolute circuit and data from the one of the adders 204 and 214 not passing through the corresponding absolute circuit.

According to the configuration of the above-described embodiment, by merely providing one or a plurality of switching means, a desired frequency component may be either suppressed or emphasized, and recording of a digital signal in which a plurality of pilot signals are selectively multiplexed or not multiplexed can be realized without providing particular circuitry for generating pilot signals.

As described above, according to the present invention, it is possible to provide a digital modulating device capable of superposing a signal component having a desired frequency on a digitally-modulated signal with a relatively simple circuit configuration. It is also possible to provide a digital recording apparatus capable of recording a digital signal on a recording medium in a state of being superposed on a desired frequency component with a simple circuit configuration.

The individual components shown in outline or designated by blocks in the drawings are all well known in the digital modulating device and digital signal recording apparatus arts and their specific construction and operation are not critical to the operation or the best mode for carrying out the invention.

While the present invention has been described with respect to what is presently considered to be the preferred embodiment, it is to be understood that the invention is not limited to the disclosed embodiment. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A digital modulating device, comprising:
    conversion means for converting n-bit data into a plurality of m-bit data which are different from each other;
    output means for selecting and outputting one of the plurality of m-bit data output from said conversion means; and
    control means for controlling said output means in accordance with the plurality of m-bit data, said control means comprising a plurality of extraction means for extracting a specific signal component from each of the plurality of m-bit data, a plurality of absolute-value calculation means for obtaining the absolute values of outputs from said plurality of extraction means, and switching means for selectively outputting (i) the outputs of said plurality of absolute-value calculation means and (ii) the outputs of said plurality of extraction means to be output to said plurality of absolute-value calculation means.

2. A device according to claim 1, wherein said switching means comprises a plurality of switching means, each of which selectively outputs (i) the output from one of said plurality of absolute-value calculation means and (ii) the output from one of said plurality of extraction means.

3. A device according to claim 2, wherein said control means further comprises selection means for controlling the selection operation of said output means so that a plurality of outputs from said plurality of switching means are supplied and the smallest output from among the plurality of outputs is selected.

4. A device according to claim 1, wherein said switching means outputs the output from said absolute-value calculation means or the output from said extraction means by periodically switching the outputs.

5. A device according to claim 1, wherein said control means further comprises a plurality of second extraction means for extracting a second specific signal component different from the specific signal component from each of the plurality of m-bit data, second absolute-value calculation means for obtaining the absolute value of an output from at least one of said plurality of second extraction means, and second switching means for selectively outputting the output from said second absolute-value calculation means and the output from the corresponding second extraction means.

6. A device according to claim 5, wherein said control means further comprises a plurality of addition means to which a plurality of first outputs from said switching means and a plurality of second outputs from said second switching means are supplied, and wherein the selection operation of said output means is controlled so that the smallest output from among outputs from said plurality of addition means is selected.

7. A device according to claim 5, wherein said second switching means outputs the output from said second absolute-value calculation mean or the output from said second extraction means by periodically switching the outputs.

8. A device according to claim 7, wherein when said second switching means output the output from said second extraction means, said switching means not outputting the output from said extraction means.

9. A digital modulating method, comprising the steps of:
    converting n-bit data into a plurality of m-bit data which are different from each other;
    extracting a specific signal component from each of the plurality of m-bit data output as a result of the conversion;
    obtaining the absolute value of each of the plurality of extracted specific signal components; and
    outputting one of the plurality of m-bit data by selectively using (i) the plurality of absolute values and (ii) the plurality of specific signal components, said outputting step comprising the steps of (a) selecting one of (i) the plurality of absolute values and (ii) the plurality of specific signal components and (b) outputting one of the plurality of m-bit data in accordance with the selection.

10. A method according to claim 9, wherein m-bit data corresponding to the smaller one of the selected absolute value and the specific signal component is output.

11. A method according to claim 9, wherein the absolute value or the specific signal component is output by being periodically switched.

12. A digital modulating device, comprising:
    modulation means for modulating digital data to obtain a plurality of modulated data having different modulation results from each other;
    output means for selecting and outputting one of the plurality of modulated data modulated by said modulation means; and
    control means for controlling said output means in accordance with the plurality of modulated data output by said modulation means, said control means including (i) extraction means for extracting specific signal components from each of the plurality of modulated data, (ii) first generation means for generating data indicating amplitudes of the plurality of extracted signal components, and (iii) second generation means for generating data indicating powers of the plurality of extracted signal components, said control means controlling said output means by (a) selecting one of (i) the data indicating the amplitudes of the plurality of extracted specific signal components and (ii) the data indicating the powers of the plurality of extracted specific signal components and (b) controlling said output means in accordance with the selected data.

13. A device according to claim 12, wherein each of the data indicating the amplitudes and the data indicating the powers comprises a plurality of data corresponding to a plurality of outputs from said modulation means, and wherein one of (i) the plurality of data indicating the amplitudes and (ii) the plurality of data indicating the powers are selected by said control means for controlling said output means.

14. A device according to claim 12, wherein modulated data corresponding to a smaller one of the data indicating the amplitudes and the data indicating the powers selected from a plurality of selected data indicating the amplitudes or a plurality of selected data indicating the powers is output.

15. A device according to claim 12, wherein the data indicating the amplitudes and the data indicating the powers is output by being periodically switched.

16. A digital signal recording apparatus, comprising:
    conversion means for converting n-bit data into a plurality of m-bit data which are different from each other;
    recording means for selecting one of the plurality of m-bit data output from said conversion means and recording the selected data on a recording medium; and
    control means for controlling the selection operation of said recording means in accordance with the plurality of m-bit data, said control means comprising a plurality of extraction means for extracting a specific signal component from each of the plurality of m-bit data, a plurality of absolute-value calculation means for obtaining the absolute values of outputs from said plurality of extraction means, and switching means for selectively outputting (i) the outputs of said plurality of absolute-value calculation means, and (ii) the outputs of said plurality of extraction means to be output to said plurality of absolute-value calculation means.

17. An apparatus according to claim 16, wherein said recording means records the m-bit data while intermittently forming a large number of tracks on the recording medium.

18. A device according to claim 17, wherein the absolute value or the specific frequency component is output by being periodically switched with a period of formation of tracks by said recording means.

19. A digital signal recording apparatus, comprising:
    modulation means for modulating digital data to obtain a plurality of modulated data having different modulation results from each other;
    recording means for selecting one of the plurality of modulated data modulated by said modulation means and recording the selected data on a recording medium; and
    control means for controlling the selection operation of said recording means in accordance with the plurality of modulated data, said control means including (i) extraction means for specific signal components from each of the plurality of modulated data, (ii) first generation means for generating data including amplitudes of the plurality of extracted signal components, and (iii) second generation means for generating data indicating power of the plurality of extracted signal components, said control means controlling the selection operation by (a) selecting one of (i) the data indicating the amplitudes of the plurality of extracted specific signal components and (ii) the data indicating the powers of the plurality of extracted specific signal components and (b) controlling the selection operation in accordance with the selected data.

20. A digital modulation device comprising:
    conversion means for converting n-bit data into a plurality of m-bit data which are different from each other;
    output means for selecting and outputting one of the plurality of m-bit data converted by said conversion means; and control means for controlling said output means in accordance with the plurality of m-bit data, said control means comprising a plurality of extraction means for extracting a specific signal component from each of the plurality of m-bit data, and a plurality of absolute-value calculation means for obtaining the absolute values of outputs of said plurality of extraction means, said control means controlling said output means by using the outputs of said plurality of absolute-value calculation means and the outputs of said plurality of extraction means to be output to said plurality of absolute-value calculation means, said control means periodically changing between selection of (a) the outputs of said plurality of absolute-value calculation means and (b) the outputs of said plurality of extraction means to be output to said plurality of absolute-value calculation means.

21. A device according to claim 20, wherein the device has a first mode in which said control means controls said output means by using only the outputs of said plurality of absolute-value calculation means, and a second mode in which said control means controls said output means by using only the outputs of said plurality of extraction means to be output to said plurality of absolute-value calculation means, the device further comprising means for periodically setting the mode of the device between the first mode and the second mode.

22. A device according to claim 21, wherein said control means controls said output means so as to output the said m-bit data corresponding to the smallest output among the outputs of said plurality of absolute-value calculation means in the first mode, and to output the m-bit data corresponding to the smallest output among the outputs of said plurality of extraction means in the second mode.

23. A device according to claim 20, wherein said control means has (i) a plurality of second extraction means for extracting a second specific signal component, different from the specific signal component, from each of the plurality of the m-bit data, and (ii) a plurality of second absolute-value calculation means for obtaining the absolute values of outputs of said plurality of second extraction means.

24. A device according to claim 23, wherein said control means further controls said output means by using the outputs of said plurality of second absolute-value calculation means and the outputs of said plurality of second extraction means to be output to said plurality of second absolute-value calculation means.

25. A device according to claim 24, wherein said control means periodically changes usage of the outputs of said plurality of second absolute-value calculation means and the outputs of said plurality of second extraction means to be output to said plurality of second absolute-value calculation means.

26. A device according to claim 20, further comprising recording means for recording the m-bit data output by said output means.

27. A device according to claim 26, wherein said recording means records the m-bit data while intermittently forming a large number of tracks on the recording medium.

28. A device according to claim 27, wherein said control means changes the usage of the outputs of said plurality of absolute-value calculation means and the outputs of said plurality of extraction means to be output to said plurality of absolute-value calculation means at a predetermined period related to a period of formation of the tracks by said recording means.

29. A digital modulation device comprising:

modulation means for modulating digital data to obtain a plurality of modulated data having different modulation results from each other;

output means for selecting and outputting one of a plurality of modulated data modulated by said modulation means; and control means for controlling said output means in accordance with the plurality of modulated data, said control means comprising (i) a plurality of sine component extraction means for extracting a sine signal component of a specific signal from each of the outputs of the plurality of modulated data, (ii) a plurality of cosine component extraction means for extracting a cosine signal component of the specific signal from each of the outputs of the plurality of modulated data, (iii) a plurality of first absolute-value calculation means for obtaining the absolute values of outputs of said plurality of sine component extraction means, and (iv) a plurality of second absolute-value calculation means for obtaining the absolute values of outputs of said plurality of cosine component extraction means, wherein the device has a first mode in which said control means controls said output means according to outputs of both of said plurality of first and second absolute-value calculation means, and a second mode in which said control means controls said output means according to the outputs of said plurality of sine component extraction means and the outputs of said plurality of second absolute-value calculation means.

30. A device according to claim 29, further comprising recording means for forming a plurality of tracks on a recording medium to record the modulated data on the plurality of tracks.

31. A device according to claim 30, wherein said recording means forms a first kind of plurality of tracks on which the modulated data having a small amount of the specific signal component are recorded in the first mode and forms a second kind of plurality of tracks on which the modulated data having a greater amount of the specific signal component are recorded in the second mode.

32. A device according to claim 29, wherein said modulation means modulates the digital data by using an interleaved NRZI method.

* * * * *

UNITED STATES PATENT AND TRADEMARK OFFICE
CERTIFICATE OF CORRECTION

PATENT NO. : 5,877,908

DATED : March 2, 1999

INVENTOR(S): MAKOTO SHIMOKORIYAMA, ET AL.

It is certified that error appears in the above-identified patent and that said Letters Patent is hereby corrected as shown below:

<u>COLUMN 5</u>,
Line 17, "f1Reference" should read --f1.  Reference--.

<u>COLUMN 6</u>,
Line 5, "terminals" should read --terminal--.

<u>COLUMN 9</u>,
Line 11, "mean" should read --means--; and
Line 15, "output" (first occurrence) should read
--outputs--.

Signed and Sealed this

Twenty-eighth Day of September, 1999

Attest:

Q. TODD DICKINSON

*Attesting Officer*          *Acting Commissioner of Patents and Trademarks*